United States Patent [19]
Young

[11] Patent Number: 4,658,160
[45] Date of Patent: Apr. 14, 1987

[54] COMMON GATE MOS DIFFERENTIAL SENSE AMPLIFIER

[75] Inventor: Ian A. Young, Portland, Oreg.

[73] Assignee: Intel Corporation, Santa Clara, Calif.

[21] Appl. No.: 782,998

[22] Filed: Oct. 1, 1985

[51] Int. Cl.$^4$ .......................... H03K 5/24; G11C 7/06
[52] U.S. Cl. .................................... 307/530; 365/190;
    365/208; 365/227; 307/355
[58] Field of Search ........................ 307/530, 362, 355;
    365/190, 202, 203, 205, 207, 208, 226, 227

[56] References Cited

U.S. PATENT DOCUMENTS

| | | | |
|---|---|---|---|
| 4,045,785 | 8/1977 | Kirkpatrick, Jr. | 365/208 X |
| 4,409,679 | 10/1983 | Kurafuji et al. | 365/190 X |
| 4,432,076 | 2/1984 | Yamada et al. | 365/190 |
| 4,479,202 | 10/1984 | Uchida | 307/530 X |
| 4,504,748 | 3/1985 | Oritani | 365/208 X |
| 4,523,110 | 6/1985 | Johnson | 365/208 X |

FOREIGN PATENT DOCUMENTS

| | | | |
|---|---|---|---|
| 157194 | 12/1980 | Japan | 365/190 |
| 198594 | 12/1982 | Japan | 365/205 |
| 79486 | 5/1984 | Japan | 365/205 |

*Primary Examiner*—Larry N. Anagnos
*Attorney, Agent, or Firm*—Blakely, Sokoloff, Taylor & Zafman

[57] ABSTRACT

A sense amplifier circuit for sensing the signals on input-output lines. Gate coupled and a.c. grounded pairs of transistors are used as sense amplifiers. Current mirror pairs of transistors are used as active loads. The gate coupled transistors provide d.c. level shifting without the need for additional circuitry, and the active current mirrors provide differential to single ended conversion of the I/O input-output signal which is then passed through one or more gain stages to drive an output buffer.

17 Claims, 3 Drawing Figures

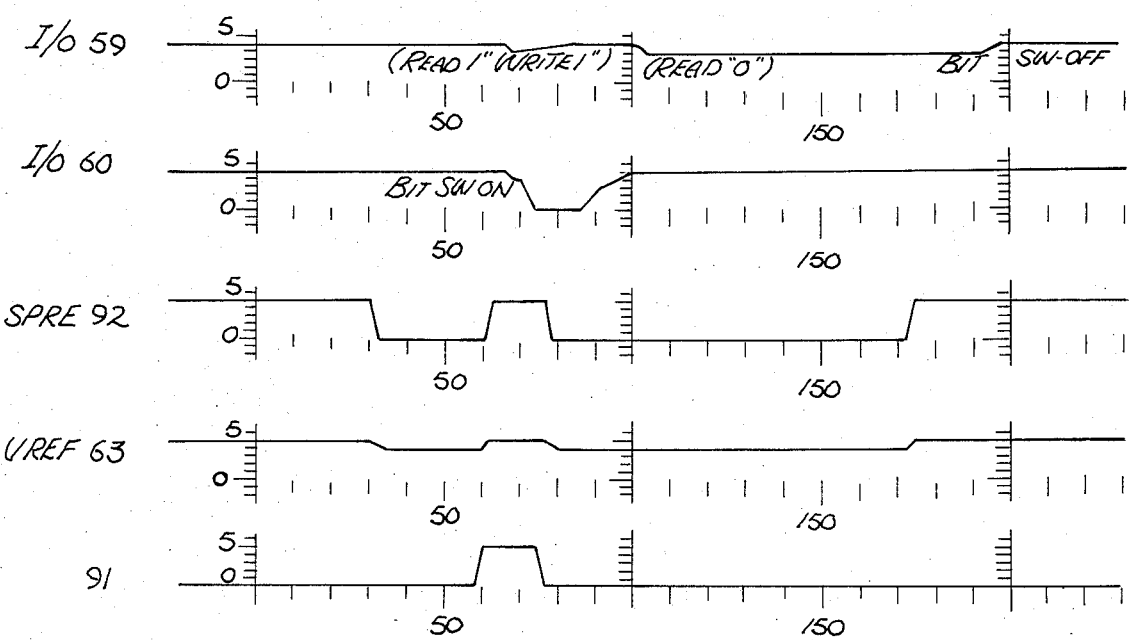
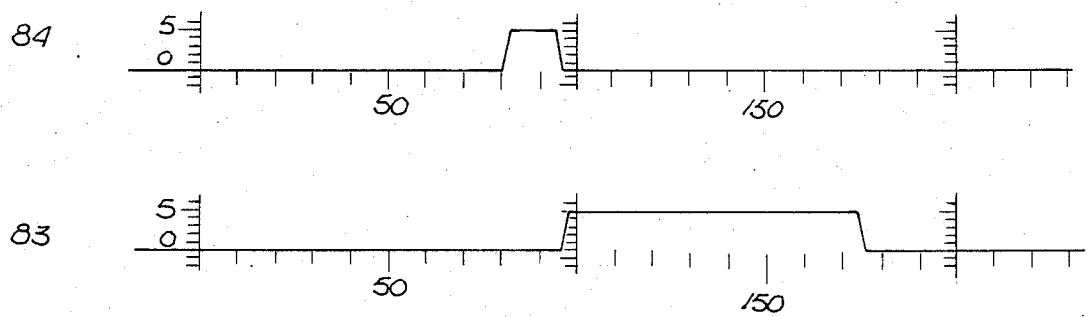
Fig. 3

COMMON GATE MOS DIFFERENTIAL SENSE AMPLIFIER

BACKGROUND OF THE INVENTION

1. Field of the Invention

This invention relates to the field of sense amplifiers, particularly those used to sense input-output lines as part of an integrated circuit.

2. Prior Art

In a memory circuit it is desired to sense the signal on input/output lines so that information may be obtained from the memory. It is also desired, having sensed the signal, to amplify it and use the signal to drive another portion of the circuit. In particular, in a memory circuit the input-output lines are sensed and amplified and the amplified signals are provided to an output buffer.

In the prior art, sensing was usually accomplished by coupling one or more stages of common source differential amplifiers to the input-output lines. A common source amplifier utilizes a pair of transistors coupled to each other at the source region. In the event that d.c. level shifting was required, prior art sense amplifiers utilized differential source follower circuits between the input-output line and the sense amplifiers.

There are several disadvantages to the prior art method of sense amplification. For example, if no level shifting circuit is utilized, the gain of the first stage amplifier (if one or more stages are utilized) is poor. If a source follower circuit is utilized before the first stage to provide level shifting and improved gain, additional delays are incurred in the signal path and a larger power supply current is required to bias the circuit.

A further disadvantage of the prior art sense amplifiers is the use of active loads consisting of transistors which have a voltage biased to their gates. This configuration results in a greater sensitivity to process variations and therefore unpredictability in the gain and delay of the resulting sense amplifier circuit.

Finally, typical prior art sense amplifiers utilize short channel length NMOS devices as the input source coupled pair. As a result, the amplifier is highly susceptible to hot electron effects.

Therefore, it is an object of the present invention to provide a sense amplifier which does not require additional level shifting circuits, is not sensitive to process variations, and is resistant to hot electron effects.

SUMMARY OF THE PRESENT INVENTION

The present invention consists of a balanced pair of differential amplifiers having a common gate. Active devices are provided by n channel current mirror loads. The gates are coupled to a common voltage reference bias which provides a small signal a.c. ground which removes Miller capacitance from the signal path. As a result, there is a very high speed of operation in the input stage. Additionally, no level shifting circuitry is required resulting in lower power consumption and higher speed.

BRIEF DESCRIPTION OF THE DRAWINGS

FIG. 3 illustrates timing diagrams of the present invention.

DETAILED DESCRIPTION OF THE PRESENT INVENTION

A differential sense amplifier utilizing common gate transistors is described. The present invention requires no additional circuitry for d.c. level shifting and operates at higher speed and lower power than prior art sense amplifiers. In the following description, numerous specific details are set forth such as conductivity type, voltage, etc., in order to provide a more thorough understanding of the present invention. It will be obvious, however, to one skilled in the art, that the present invention may be practiced without these specific details. In other instances, well-known circuits have not been described in detail in order not to unnecessarily obscure the present invention.

Prior Art

Figure 1:
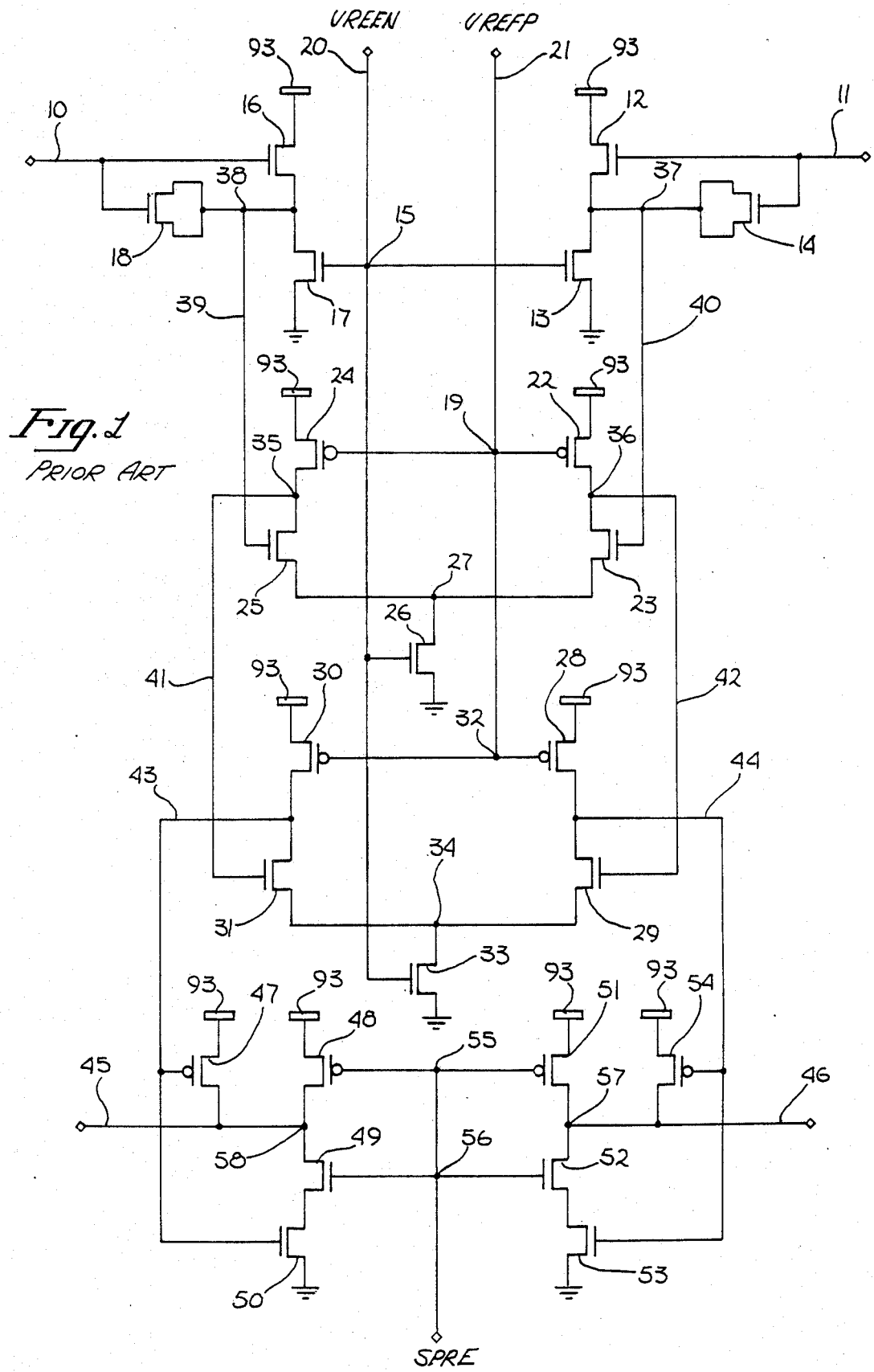
FIG. 1 illustrates a sense amplifier circuit of the prior art.

In integrated circuit memories, differential sense amplifiers are utilized to sense a signal on input-output lines, amplify the signal and provide the amplified signal to other portions of the memory such as an output buffer. An example of prior art sense amplifiers is illustrated in FIG. 1.

Input-output lines 10 and 11 are coupled to the prior art sense amplifier circuit. The circuit shown is a three-stage sense amplifier. The first stage is a level shifting circuit and consists of transistors 12, 13, 14, 16, 17 and 18. The gates of transistors 12 and 14 are coupled to input-output line 11. At node 37 the source of transistor 12 is connected to the drain of transistor 13. The source of transistor 13 is grounded while the drain of transistor 12 is coupled to voltage source VCC 93. The source and drain of transistor 14 are both coupled to node 37 along with the source of transistor 12 and drain of transistor 13.

Input-output line 10 is coupled to the gate of transistor 16 and the gate of transistor 18. At node 38, the source of transistor 16 is connected to the drain of transistor 17. The drain of transistor 16 is coupled to VCC 93. The source and drain of transistor 18 are each coupled to node 38 as well. The gates of transistors 13 and 17 are each coupled to node 15. Node 15 is coupled to VREFN. VREFN provides a voltage reference bias to the gates of transistors 13 and 17.

The second stage of the prior art sense amplifier circuit is a gain stage and consists of transistors 22, 23, 24 and 25. Transistors 22 and 24 are p-channel transistors and are used to provide a load to the stage. Transistors 23 and 25 are n-channel transistors. Transistors 22 and 23 are drain coupled to each other at node 36. The source of transistor 22 is coupled to VCC 93. The gate of transistor 23 is coupled to node 37 of stage 1 while the gate of transistor 22 is coupled through node 19 to VREFP which provides a gate voltage bias. Transistors 24 and 25 are drain coupled together at node 35 with the gate of transistor 25 coupled to node 38 of stage 1. The gate of transistor 24 is coupled through node 19 to VREFP. The source of transistor 24 is coupled to VCC 93. The sources of the transistors 23 and 25 are coupled together at node 27 along with the drain of transistor 26. The source of transistor 26 is coupled to ground and the gate of transistor 26 is coupled to VREFN. Transistor 26 is the current source for the differential gain stage formed by transistors 23 and 25.

The third stage of the prior art circuit consists of p-channel load devices 28 and 30 and n channel transistors 29 and 31. This stage is also a gain stage. Transistors 28 and 29 are drain coupled together. The gate of transistor 29 is coupled to node 36 of stage 2. Transistors 30 and 31 are drain coupled together. The gate of transistor 31 is coupled to node 35 of stage 2. The gates of transistor 28 and 30 are coupled through node 32 to VREFP. The source of transistors 28 and 30 are coupled to VCC 93. The sources of transistors 29 and 31 are coupled together through node 34 to transistor 33. The source of transistor 33 is coupled to ground and the gate of transistor 33 is coupled to VREFN. Transistor 33 is the current source for the differential gain stage formed by transistors 29 and 31.

Signals on line 10 and 11 enter the first stage of the sense amplifier circuit, are amplified and travel to the second stage on lines 39 and 40 (nodes 38 and 37 respectively). These signals are then amplified at the second stage and travel on lines 41 and 42 (nodes 35 and 36 respectively) to the final stage, where they are amplified a third time and output on lines 43 and 44 to the inverter gain stage controlled by SPRE where they are finally outputted on lines 45 and 46 respectively.

After the third stage is an inverter comprised of p-channel transistor 47 and n-channel transistor 50 for line 43 and p-channel transistor 54 and n-channel transistor 53 for line 44. The inverter is powered up and down by p-channel transistors 48 and 51 and n-channel transistors 49 and 52.

Transistor 51 is drain coupled to transistor 52 at node 57. The drain of transistor 53 is coupled to the source of transistor 52, with the source of transistor 53 grounded. The source of transistor 54 is coupled to VCC 93. The gate of transistors 53 and 54 are coupled to line 44.

Transistor 48 is drain coupled to transistor 49 at node 58. The drain of transistor 49 at node 58. The source of transistor 49 is coupled to the drain of transistor 50, whose source is grounded. The drain of transistor 47 is coupled to node 58. The gates of transistors 47 and 50 are coupled to line 43.

The gates of transistors 48, 49, 51 and 52 are coupled to signal SPRE. The sources of transistors 47 and 54, along with the sources of transistors 48 and 51, are coupled to VCC 93.

In the prior art embodiment described above, the second and third stage of the sense amplifier provides amplification of the I/O signal by a factor of 4. The level shifting circuitry at the beginning of the amplifier attenuates the signal by approximately one half. Therefore, three stages are need to to provide gain of 20 to 30 amplification to the I/O signal. This number of stages takes up valuable silicon space on the die. Additionally, in order to provide d.c. level shifting, additional circuitry is required between the I/O lines and the sense amplifier, further adding to the area of the circuit, as well as attenuating the signal by up to a factor of one half.

The active load portion of the circuit utilizes transistors 24, 22, 30, 28 whose gates are coupled to biasing voltage VREFP. This arrangement is highly sensitive to process variations and thus affects performance and yield since the current in these loads have to track and match the current sources formed by transistors 26 and 33 respectively.

The input stages utilize N channel transistors such as 25 and 23 for differential gain for stage 1 and 31 and 29 for stage 2. These N channel devices have the disadvantage of being susceptable to hot electron effects.

Preferred Embodiment

Figure 2:
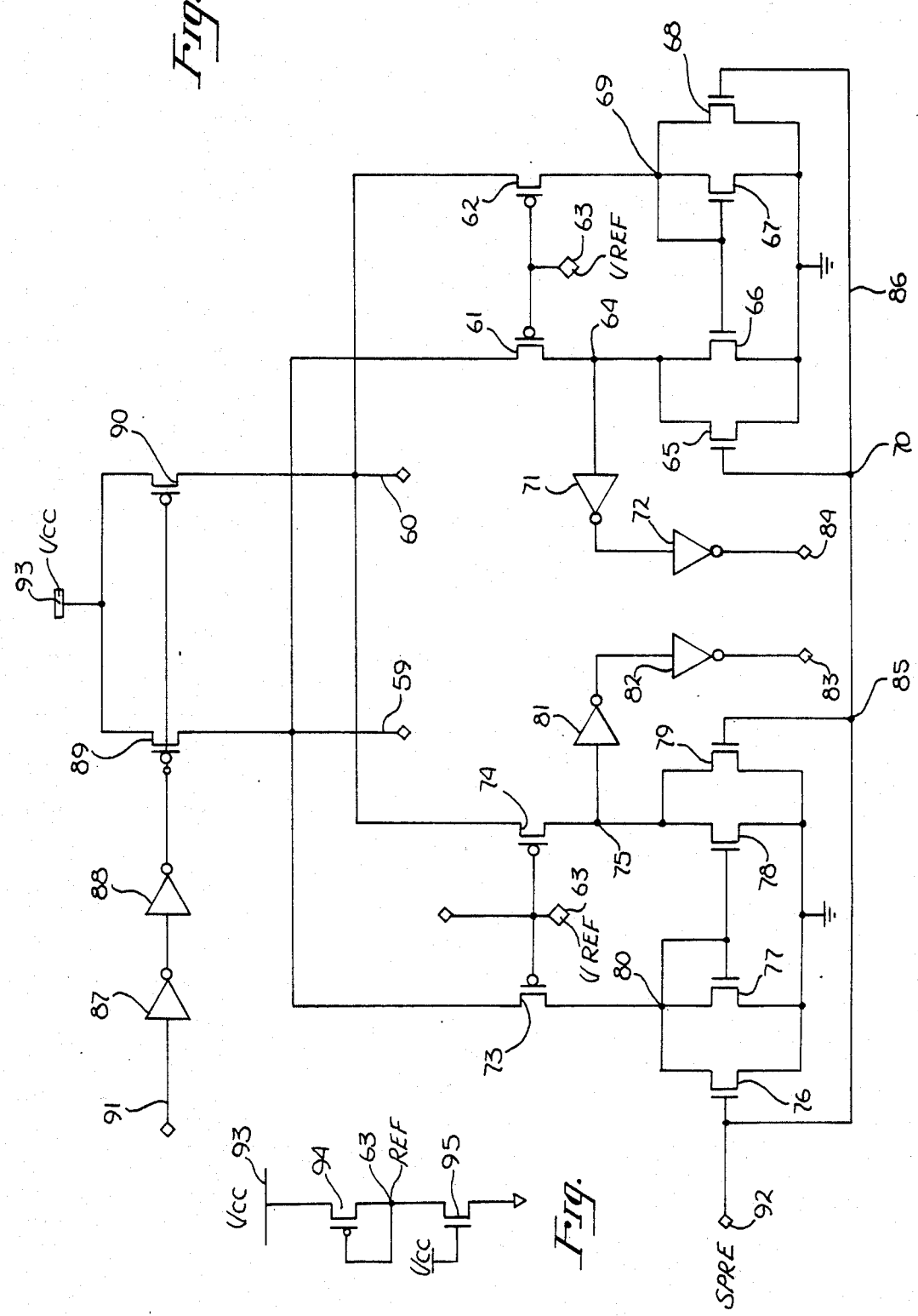
FIG. 2 is an electrical schematic illustrating the preferred embodiment of the present invention.

The preferred embodiment of the present invention is illustrated in FIG. 2. Input-output (I/O) lines 59 and 60 are held at Vdsat away from VCC, in the absence of a signal by p-channel transistors 89 and 90. Transistor 89, coupled to I/O line 59, and transistor 90, coupled to I/O line 60, have their gates grounded by signal 91 acting through invertors 87 and 88 coupled to the gates. Transistors 89 and 90 are source coupled to VCC and provide the current that pulls the I/O lines to VCC (less drain to source saturation voltage drop). In the preferred embodiment, transistors 89 and 90 are P channel devices. The I/O lines are connected to two pairs of common gate P channel transistors. Transistors 73 and 74 make up one pair of the common gate coupled transistors while transistors 61 and 62 make up the other pair. The I/O lines are connected to the transistors in a cross-coupled balanced connection with I/O line 59 coupled to transistor 73 and transistor 61 while I/O line 60 is coupled to transistor 74 and transistor 62. The gates of each pair of transistors are coupled to a voltage reference source VREF 63 which is lower than VCC by an amount slightly greater than Vdsat+Vt. VREF 63 is produced by drain coupled transistors 94 and 95. Transistor 94 is a p-channel transistor whose source is coupled to VCC 93 and whose gate is coupled to its drain. N-channel transistor 95 has its source coupled to ground and its gate coupled to VCC. VREF is taken from the junction of the gate and drain of transistor 94 and the drain of transistor 95. Because the gate and drain of transistor 94 are coupled together, VREF 63 is taken below VCC by the threshold voltage of transistor 94 ($V_t$) plus by an additional amount represented by the difference between the gate/source voltage (Vgs) and $V_t$. Therefore, VREF is equal to $VCC - V_T - (V_{gs} - V_T)$. By biasing the common gate transistors to VREF 63, if a signal is developed on the I/O lines, there will be an unbalanced d.c. current flowing through each of these 4 transistors from VCC and into active load n-channel current mirrors.

The current mirror for transistors 61 and 62 are made up of one transistor pair 66 and 67. Transistors 65 and 66 are drain connected to transistor 61 at node 64. Transistor 67 and 68 are drain connected to transistor 62 at node 69. Each transistor 65 through 68 is source connected to ground. Transistor 66 and 67 are gate coupled to each other and to node 69. The gates of transistors 65 and 68 are each coupled to SPRE 92 through line 86. SPRE 92 is a power-up signal.

The current mirrors for transistors 73 and 74 are connected in similar fashion as follows. A pair of transistors 76 and 77 are drain connected to transistor 73 at node 80 and source connected to ground. Transistor 78 and 79 are drain connected to transistor 74 and are also source connected to ground. Transistors 77 and 78 are gate coupled to each other and to node 80. The gates of transistors 76 and 79 are each coupled to SPRE 92 through line 86. An output line coupled to node 64 couples the output of the sense amplifier to a pair of single ended inverters 71 and 72 ending in output 84. The second output line is coupled to node 75 and a signal through single ended inverters 81 and 82 in series, ending in output 83.

Common voltage source VREF 63 of the gate coupled pairs of transistors provides a small signal a.c. ground. The common gate transistors provide d.c. level shifting of the I/O signal from VCC to approximately VCC/2. As a result, no additional level shifting circuitry is required for the sense amplifier. The common gate transistors provide high speed voltage amplification of the signal into the active load current mirrors. When a signal is developed on either one of the I/O lines 59 and 60, an imbalance is created for the gate to source bias for the differential devices causing a difference in the current flowing through the devices in the pairs of transistors 73 and 74 and transistors 61 and 62. The active load current mirrors perform differential to single ended conversion and have balanced differential outputs centered around VCC/2. By developing the output signal symmetrically around VCC/2, the available power swing is maximized. This output voltage is then amplified further through inverter gain stages 71 and 72 for one output and gain stages 81 and 82 for the other output before driving, for example, the output buffer.

Because the input stage of the sense amplifier utilizes a grounded common gate configuration, the Miller capacitance is removed from the signal path and grounded. Thus, the input stage is very high speed (high bandwidth) and has a low impedance input. The single balanced differential stage of the present invention provides as much d.c. gain as a level shifter and two gain stages in the prior art method. The circuit has the further advantage of lower power consumption because of the reduced number of stages of differential gain. This is achieved without sacrificing speed/delay performance parameters. Additionally, the sense amplifier is not susceptible to hot electron effects since the input devices in this case are p channel devices.

The sense amplifier of the present invention is coupled, through I/O lines 59 and 60, to a plurality of memory cells storing bits of information. Although not shown, the memory cells typically contain n channel pulldown transistors which are cross-coupled to the I/O lines through access transistors.

Referring to FIG. 3, timing diagrams illustrating the relationship of signals during operation of the preferred embodiment are shown. The y-axis in the graphs is voltage and the x-axis is time in nanoseconds. As shown in FIG. 3, I/O lines 59 and 60 are held at a level near VCC. WED 91 is normally low, permitting transistors 89 and 90 to conduct and hold the I/O lines as VCC−Vdsat. Initially a READ Data=1 is occurring, then at approximately 60 nanoseconds, a write operation is performed in which a "1" is written to the memory. The I/O 59 is driven to VCC and I/O 60 driven to ground. In that situation, WED goes high, shutting off transistors 89 and 90 and coupling the write signal to I/O lines 59 and 60. SPRE 92 goes high as well, so that the sense amplifier does not sense the signal during the write operation. As shown by the graphs, I/O 59 remains high while I/O 60 goes low; writing a "1" into a memory cell on lines 59 and 60.

At approximately 100 nanoseconds, a read "0" operation is performed. During read operations, SPRE 92 goes low, powering up the sense amplifier. WED 91 goes low, so that I/O 59 and 60 are again set to VCC. I/O 60 is pulled high to VCC while I/O 59 is pulled below VCC by an amount that equals the I/O signal, because of the "0" written into the memory cell. As a result, a current difference is generated in the I/O lines 59 and 60 through the common gate differential pair 74, 73 and 61, 62. The high signal of I/O 60 and low signal of I/O 59 causes greater current in 74 than 73 resulting in a high output at node 75 and therefore output line 83 is high. The high signal of I/O 60, and low signal of 59 similarly causes greater current in 62 than 61. As a result, a low signal is output at node 64 and therefore output line 84 is low. This situation is shown in FIG. 3 by the graphs of output 83 at the 80–100 nanosecond mark.

Thus, a sense amplifier has been described which does not require additional circuitry for d.c. level shifting, is not susceptible to hot electron effects, and provides the same speed/delay performance as prior art circuitry at lower power levels than prior art circuitry.

I claim:

1. A FET sense amplifier for sensing first and second data lines, said sense amplifier comprising:

first and second common gate transistors of a first conductivity type and each having an input and an output, said first transistor having its input coupled to said first data line and said second transistor having its input coupled to said second data line third and fourth common gate transistors of said first conductivity type and each having an input and an output, said third transistor having its input coupled to said first data line and said fourth transistor having its input coupled to said second data line;

said gates of said first, second, third and fourth transistors coupled to a reference voltage independent of said first and second data lines;

first active loads coupled to the output of said first and second common gate transistors;

second active loads coupled to the output of said third and fourth common gate transistors;

first and second output lines coupled to said first and second active loads.

2. The sense amplifier of claim 1 wherein said first and second transistors are p-channel transistors and said third and fourth transistors are p-channel transistors.

3. The sense amplifier of claim 2 wherein the sources of said first and third p-channel transistors are coupled to said first data line, and the sources of said second and fourth p-channel transistors are coupled to said second data line.

4. The sense amplifier of claim 3 wherein said reference voltage is less than the voltage level of signals on said first and second data lines.

5. The sense amplifier of claim 4 wherein said first active loads comprise current mirrors consisting of first, second, third, and fourth n-channel transistors, said first and second n-channel transistors drain coupled to the drain of said first p-channel transistor and source coupled to ground, said third and fourth n-channel transistors drain coupled to the drain of said second p-channel transistor and source coupled to ground, the gates of said second and third n-channel transistors coupled to the drain of said first p-channel transistor, the gates of said first and fourth n-channel transistors coupled to a first control signal.

6. The sense amplifier of claim 5 wherein said second active load comprises current mirrors consisting of fifth, sixth, seventh and eighth n-channel transistors, said fifth and sixth n-channel transistors drain coupled to the drain of said third p-channel transistor and source coupled to ground, said seventh and eighth n-channel transistors drain coupled to the drain of said fourth p-channel transistor and source coupled to ground, the gates of said sixth and seventh n-channel transistors coupled to the drain of said fourth p-channel transistor, the gates of said fifth and eighth n-channel transistors coupled to said first control signal.

7. The sense amplifier of claim 6 wherein said first output line is coupled to the drain of said second p-channel transistor.

8. The sense amplifier of claim 7 wherein said second output line is coupled to the drain of said third p-channel transistor.

9. A FET circuit for sensing first and second data lines comprising:
first and second gate coupled transistors of a first conductivity type and each having an input and an output,
third and fourth gate coupled transistors of said first conductivity type and each having an input and an output, said first and third transistors each having its input coupled to said first data line;
said second and fourth transistors each having its input coupled to said second data line;
the gates of said first, second, third and fourth transistors coupled to a reference voltage independent of said first and second data lines;
a first plurality of transistors of a second conductivity type coupled to the output of said first and second transistors, said first plurality of transistors providing an active load for said first and second transistors;
a second plurality of transistors of a second conductivity type coupled to the output of said third and fourth transistors, said second plurality of transistors providing an active load for said third and fourth transistors;
first amplifying means coupled to said first and second transistors and said first plurality of transistors for amplifying signals produced by said first and second transistors and said first plurality of transistors;
second amplifying means coupled to said third and fourth transistors and said second plurality of transistors for amplifying signals produced by said third and fourth transistors and said second plurality of transistors;
whereby an improved sense amplifier is realized.

10. The circuit of claim 9 wherein said first and second transistors are p-channel transistors, the source of said first p-channel transistor coupled to said first data line, the source of said second p-channel transistor coupled to said second data line.

11. The circuit of claim 10 wherein said third and fourth transistors are p-channel transistors, the source of said third p-channel transistor coupled to said first data line, the source of said fourth p-channel transistor coupled to said second data line.

12. The circuit of claim 11 wherein said first plurality of transistors comprise first, second, third, and fourth n-channel transistors, the drains of said first and second n-channel transistors coupled to the drain of said first p-channel transistor and to the gates of said second and third n-channel transistors, the drain of said third and fourth n-channel transistors coupled to the drain of said second p-channel transistor, the sources of said first, second, third, and fourth n-channel transistors coupled to ground, the gates of said first and fourth n-channel transistors coupled to a first control signal.

13. The circuit of claim 12 wherein said first amplifying means is coupled to the drain of said second p-channel transistor.

14. The circuit of claim 13 wherein said second plurality of transistors comprise fifth, sixth, seventh, and eighth n-channel transistors, the drains of said fifth and sixth n-channel transistors coupled to the drain of said third p-channel transistor, the drains of said seventh and eighth n-channel transistors coupled to the drain of said fourth p-channel transistor and to the gates of said sixth and seventh n-channel transistors, the sources of said fifth, sixth, seventh, and eighth n-channel transistors coupled to ground, the gates of said fifth and eighth n-channel transistors coupled to said first control signal.

15. The circuit of claim 14 wherein said second amplifying means is coupled to the drain of said third p-channel transistor.

16. The circuit of claim 15 wherein said first and second amplifying means each comprise a pair of series connected amplifiers.

17. The circuit of claim 16 wherein the gates of said first, second, third and fourth p-channel transistors are coupled to a reference voltage, said reference voltage being less than signal voltage of said first and second data lines.

* * * * *